United States Patent
Seyyedy

(10) Patent No.: US 6,424,584 B1
(45) Date of Patent: Jul. 23, 2002

(54) REDUNDANCY ANTIFUSE BANK FOR A MEMORY DEVICE

(75) Inventor: Mirmajid Seyyedy, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/293,353

(22) Filed: Apr. 16, 1999

(51) Int. Cl.[7] .............................. G11C 7/00
(52) U.S. Cl. .................... 365/225.7; 365/185.09; 365/185.25; 365/189.07
(58) Field of Search .............. 365/225.7, 185.09, 365/185.25, 189.07

(56) References Cited

U.S. PATENT DOCUMENTS

| | | | | |
|---|---|---|---|---|
| 5,923,672 A | * | 7/1999 | Roberts et al. | 371/10.2 |
| 6,011,742 A | * | 1/2000 | Zheng | 365/225.7 |
| 6,064,617 A | * | 5/2000 | Ingalls | 365/225.7 |
| 6,163,488 A | * | 12/2000 | Tanizaki et al. | 365/200 |
| 6,266,291 B1 | * | 7/2001 | Sher et al. | 365/226 |
| 6,301,164 B1 | * | 10/2001 | Manning et al. | 365/200 |

* cited by examiner

*Primary Examiner*—Richard Elms
*Assistant Examiner*—Tuan T. Nguyen
(74) *Attorney, Agent, or Firm*—Dorsey & Whitney LLP

(57) ABSTRACT

A detector circuit for detecting a digital word matching a bit pattern programmed by fusible devices. The detector circuit includes decoder circuits coupled to first and second sense nodes, and a reference node, and further includes an evaluation circuit also coupled to the first and second sense nodes. The evaluation circuit senses the voltage of both sense nodes and produces a match signal according to these voltages. The voltage of the first and second sense nodes are determined by the programmed status of the decoder circuit and whether a matching bit is detected. The decoder circuit includes a fusible device, such as an antifuse, and a switch having a control terminal coupled to receive one bit of the digital word. An enable circuit may also be coupled to the detector circuit to either enable or disable operation of the detector circuit based on whether the enable circuit has been programmed.

52 Claims, 7 Drawing Sheets

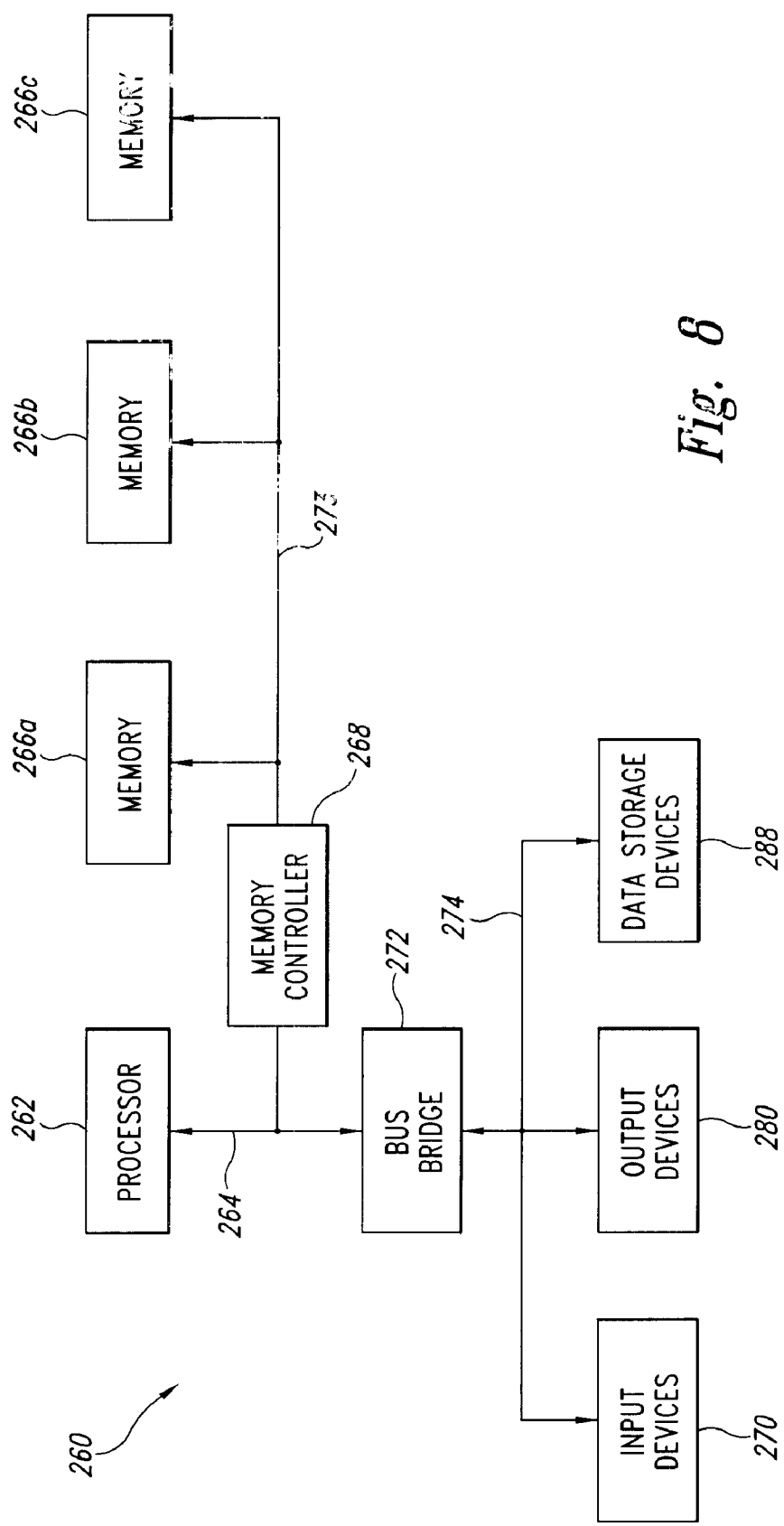

REDUNDANCY ANTIFUSE BANK FOR A MEMORY DEVICE

TECHNICAL FIELD

The present invention relates to integrated circuit devices, and more particularly, to antifuse circuits in memory devices.

BACKGROUND OF THE INVENTION

Typical integrated memory devices include arrays of memory cells arranged in rows and columns. In many such memory devices, several redundant rows and columns are provided to replace malfunctioning memory cells found during testing. Testing is typically performed by having predetermined data values written to selected row and column addresses that correspond to memory cells. The memory cells are then read to determine if the data read matches the data written to those memory cells. If the read data does not match the written data, then those memory cells are likely to contain defects which will prevent proper operation of the memory device.

The defective memory cells may be replaced by enabling the redundant circuitry. A malfunctioning memory cell in a column or a row is substituted with an entire column or row of redundant memory cells. Therefore, a memory device need not be discarded even though it contains defective memory cells. Substitution of one of the redundant rows or columns is accomplished in a memory device by programming a specific combination of fuses, or if the memory device uses antifuses, by programming a specific combination of antifuses, located in one of several fuse or antifuse blocks in the memory device. Conventional fuses are resistive devices which may be opened or broken with a laser beam or an electric current. Antifuses are capacitive devices that may be closed or blown by breaking down a dielectric layer in the antifuse with a relatively high voltage.

A specific combination of antifuses are programmed to correspond to an address of a row or column having defective memory cells. For example, if the defective row or column has a 12-bit binary address of 100100100100, then the antifuses in a set of 12 antifuses are programmed to store this address. Antifuses are typically arranged in an antifuse bank with the number of antifuses corresponding to the number of address bits for a row or column address. The memory device contains several antifuse banks so that several redundant rows and columns can be substituted for defective memory cells.

When the programmed redundant address is detected by the memory device, the redundant row or column is accessed instead of the row or column having the defective memory cells. The antifuse bank compares the incoming addresses to the redundant addresses programmed by the antifuses, and determines whether there is a match. If a match is detected, then the corresponding antifuse bank outputs a match signal. The match signal indicates that a redundant row or column should be accessed, and the defective row or column should be ignored.

A problem with conventional antifuse banks is that they occupy a significant amount of the total layout area of a memory device. This is a result of the current design of conventional antifuse banks. Each antifuse of the antifuse bank includes circuitry dedicated to programming and comparing that one antifuse. As shown in FIG. 1, a conventional antifuse bank 10 includes several antifuse circuits 12a–g. There is one antifuse circuit 12 for each address bit of a row or column address A0–Am. Each antifuse circuit 12a–g includes the same elements. In particular, an antifuse 16, a programming circuit 18 for programming the antifuse 16, and a comparing circuit 20 that compares a respective bit of the incoming address to the programmed state of the corresponding antifuse 16. Conventional antifuse comparing and programming circuits are well known in the art and do not need to be discussed in detail herein. The comparing circuit 20 generates a high COMP signal when the respective bit of the incoming address matches the programmed state of the antifuse 16. Each comparing circuit provides a COMP signal to a judgment circuit 24 that generates a MATCH signal when all of the antifuse circuits 12a–g provide a high COMP signal.

As illustrated by FIG. 1, the structure of a conventional antifuse bank 10 consists of the same basic circuitry repeated for each bit of a row or column address. In the case of the programming circuit 18, which has several transistors having physically large dimensions because of the high current necessary to program an antifuse, having one programming circuit 18 for each antifuse 16 requires a significant portion of the overall layout area of a memory device. Another consideration is that, as the number of memory cells for a memory device continues to increase, additional address bits will be required to access the memory cells. Consequently, antifuse circuits 12 corresponding to the additional address bits will also be required to facilitate replacement of any defective memory cells, thus further increasing the layout area occupied by an antifuse bank 10.

SUMMARY OF THE INVENTION

The present invention is directed to a method and apparatus for detecting a digital word on a plurality of signal lines matching a bit pattern programmed by a corresponding plurality of fusible devices. A detector circuit comprises decoder circuits coupled between first and second sense nodes and a reference node, and an evaluation circuit also coupled to the first and second sense nodes to generate a match signal indicative of detecting the digital word. The decoder circuits may comprise a fusible device and a switch, where closing the switch of a programmed fusible device will change the voltage of the sense node to which the decoder circuit is coupled. The evaluation circuit senses the voltage of both sense nodes and produces a match signal according to these voltages. An enable circuit may also be coupled to the detector circuit to either enable or disable operation of the detector circuit based on whether the enable circuit has been programmed.

BRIEF DESCRIPTION OF THE DRAWINGS

FIG. 8 is a block diagram of an embodiment of a computer system including the memory device illustrated in FIG. 7.

DETAILED DESCRIPTION OF THE INVENTION

Figure 1:
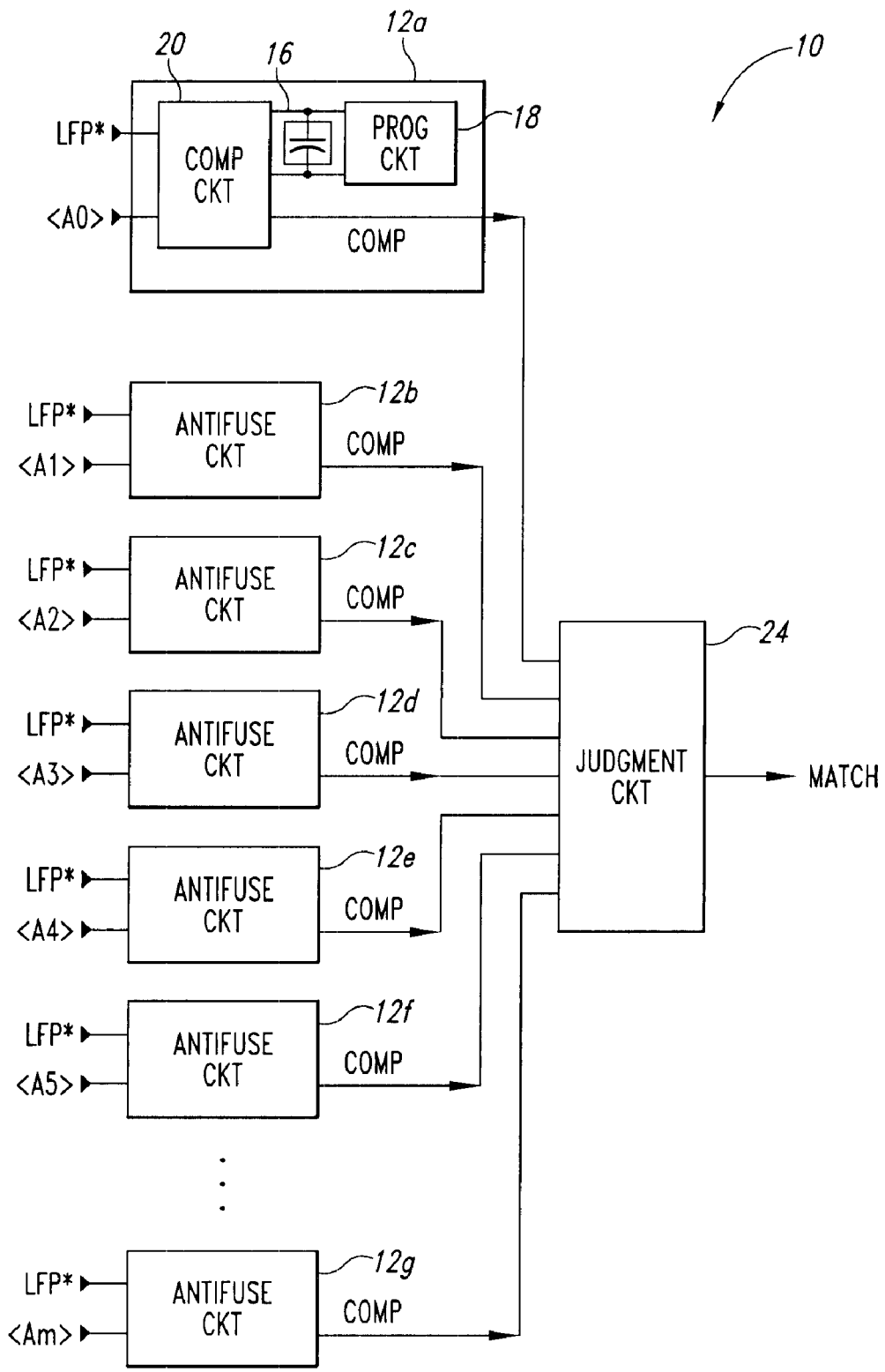
FIG. 1 is a block diagram of a conventional antifuse bank.
Figure 2:
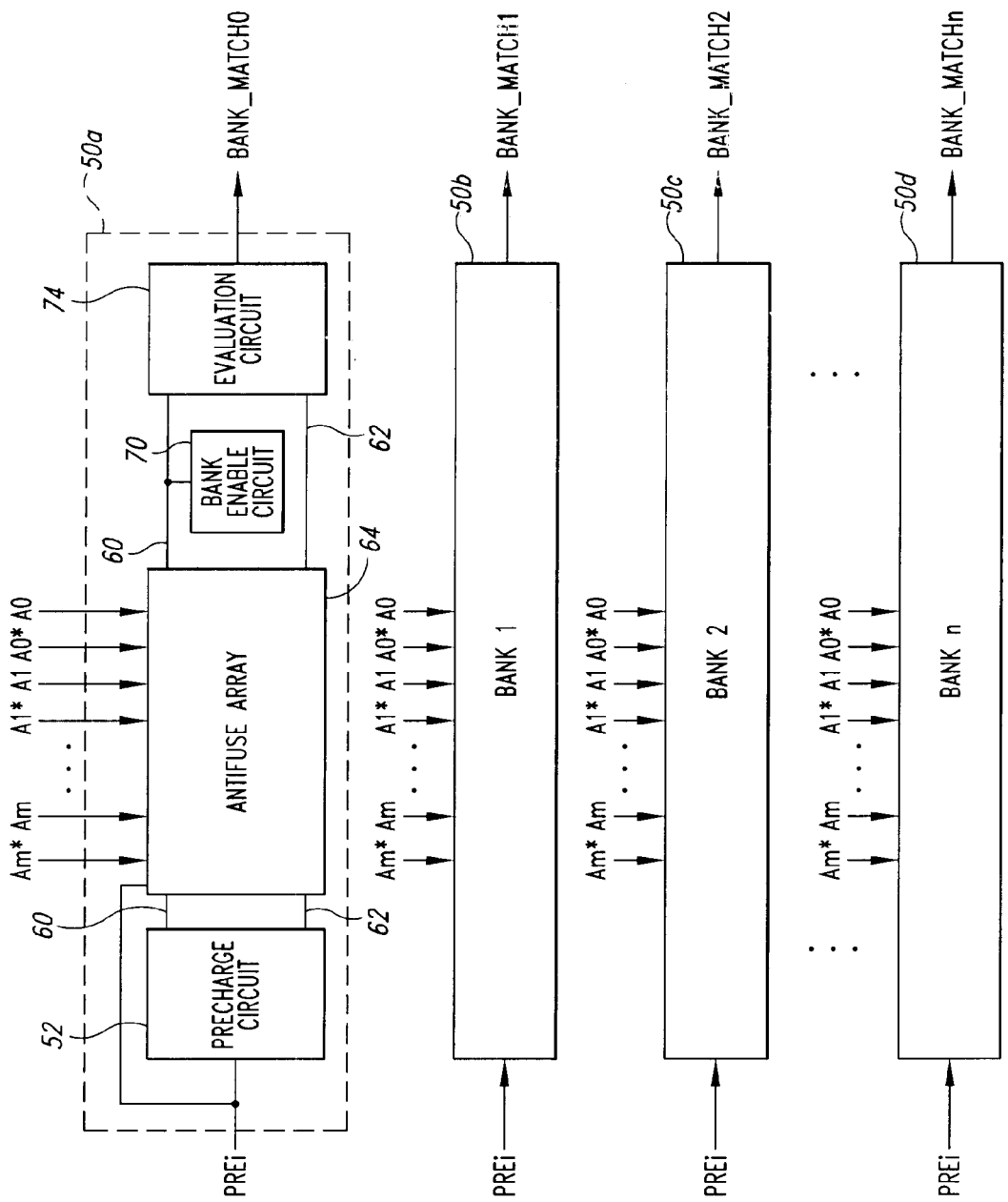
FIG. 2 is a block diagram of an antifuse bank according to an embodiment of the present invention.

Shown in FIG. 2 are antifuse banks 50a–d. Each antifuse bank 50a–d is in accordance to an embodiment of the present invention that may be substituted for a conventional antifuse bank. The antifuse banks 50a–d will generate a high BANK_MATCH signal when a current row or column address A0–Am matches the redundant row or column address, respectively, programmed by the antifuses of each antifuse bank 50a–d. Rather than the having a structure consisting of a network of individual antifuse comparing and programming circuits, like the conventional antifuse block 10 (FIG. 1), each antifuse bank 50a–d shares many comparing and programming elements between the individual antifuses located within each antifuse bank 50a–d.

In the interests of brevity, the construction and operation of the antifuse banks 50a–d will be explained with specific reference to antifuse bank 50a. The remaining antifuse banks 50b–d are constructed and operated in the same manner as antifuse bank 50a. The antifuse bank 50a will be described in general, with a more detailed explanation thereafter.

The antifuse bank 50a includes a precharge circuit 52 coupled to receive a precharge signal PREI that activates the antifuse bank 50a. While the PREI signal is inactive, or low, the precharge circuit 52 precharges a pair of precharge nodes in preparation for an address detection operation. Upon receiving an active PREI signal that initiates an address detection operation, the precharge circuit 52 couples the precharge nodes to a pair of sense lines 60, 62 of an antifuse array 64. Consequently, the voltage of the sense lines 60, 62 are raised to approximately the precharge voltage. Non-complementary and complementary address signals of the current address A0–Am are simultaneously strobed into the antifuse array 64 by the active PREI signal. If the address A0–Am strobed into the antifuse array 64 matches the redundant address programmed by the antifuses, each of the sense lines 60, 62 will continue to have a voltage nearly equal to the precharge voltage. Conversely, if the address A0–Am does not match the redundant address, at least one of the sense lines 60, 62 will be discharged and have a voltage much lower than the precharge voltage.

A bank enable circuit 70 is coupled to the sense line 60. The bank enable circuit 70 must be enabled for the corresponding antifuse bank circuit to be functional. As will be explained in greater detail below, if none of the redundant rows or columns associated with the antifuse bank circuit are used, the enable circuit 70 should not be programmed so the antifuse bank 50a will always generate an inactive low BANK_MATCH signal.

An evaluation circuit 74 coupled to the antifuse array 64 senses the resulting voltage of the sense lines 60, 62, and generates the BANK_MATCH signal. As mentioned previously, when the current address A0–Am matches the redundant address, resulting in both the sense lines 60, 62 being nearly equal to the precharge voltage, the evaluation circuit 74 will sense the voltage and generate a high BANK_MATCH signal indicating a match. Otherwise, the evaluation circuit 74 will generate a low BANK_MATCH signal indicating that the current address A0–Am does not match the programmed address. The resulting BANK_MATCH signal can be used in a manner similar to the MATCH signal of the conventional antifuse bank 10 (FIG. 1).

Figure 3:
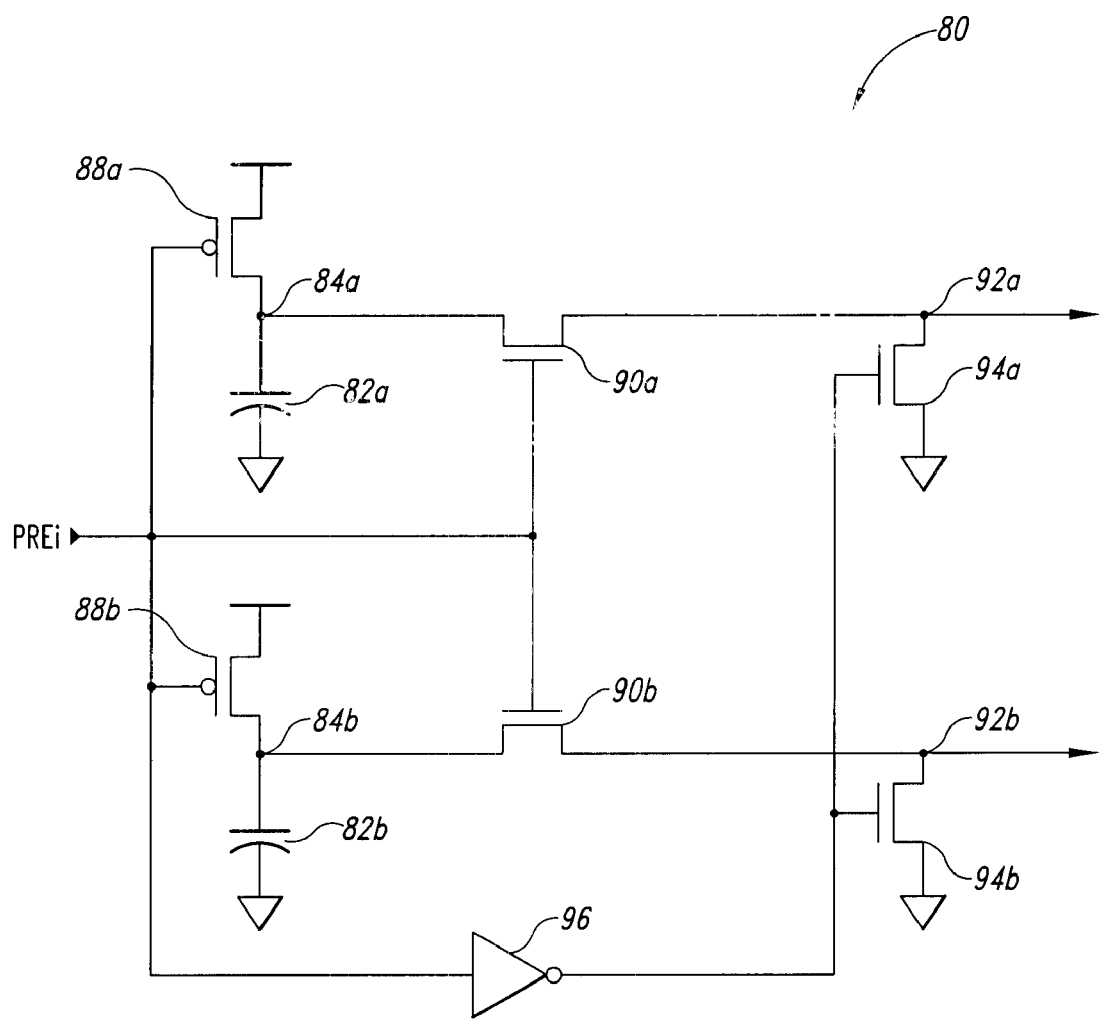
FIG. 3 is a schematic diagram of a precharge circuit according to an embodiment of the present invention.

FIG. 3 illustrates an embodiment of a precharge circuit 80 that may be used as the precharge circuit 52 of FIG. 2. A capacitor 82a is charged by coupling a charging node 84a to a supply terminal through a PMOS charging transistor 88a that is turned ON by the inactive PREI signal. Similarly, a capacitor 82b is also charged by coupling a charging node 84b to a supply terminal through a PMOS charging transistor 88b. A pair of NMOS isolating transistors 90a, 90b are switched OFF by the low PREI signal to isolate the charging nodes 84a, 84b from a respective sense node 92a, 92b. At the same time the capacitors 82a, 82b are charging, the sense nodes 92a, 92b are discharged through a respective NMOS discharging transistor 94a, 94b switched ON by the output of an inverter 96. The sense nodes 92a, 92b are coupled to a ground node in order to fully discharge the sense nodes 92a, 92b prior to initiating all address detection operation.

When the PREI signal becomes active, or high, the PMOS charging transistors 88a, 88b and the NMOS discharging transistors 94a, 94b are switched OFF. The sense nodes 92a, 92b are simultaneously coupled to the respective charging nodes 84a, 84b by switching ON isolating transistors 90a, 90b. Consequently, the voltage of the sense nodes 92a, 92b are raised to the voltage of the charging nodes 84a, 84b.

Figure 4:
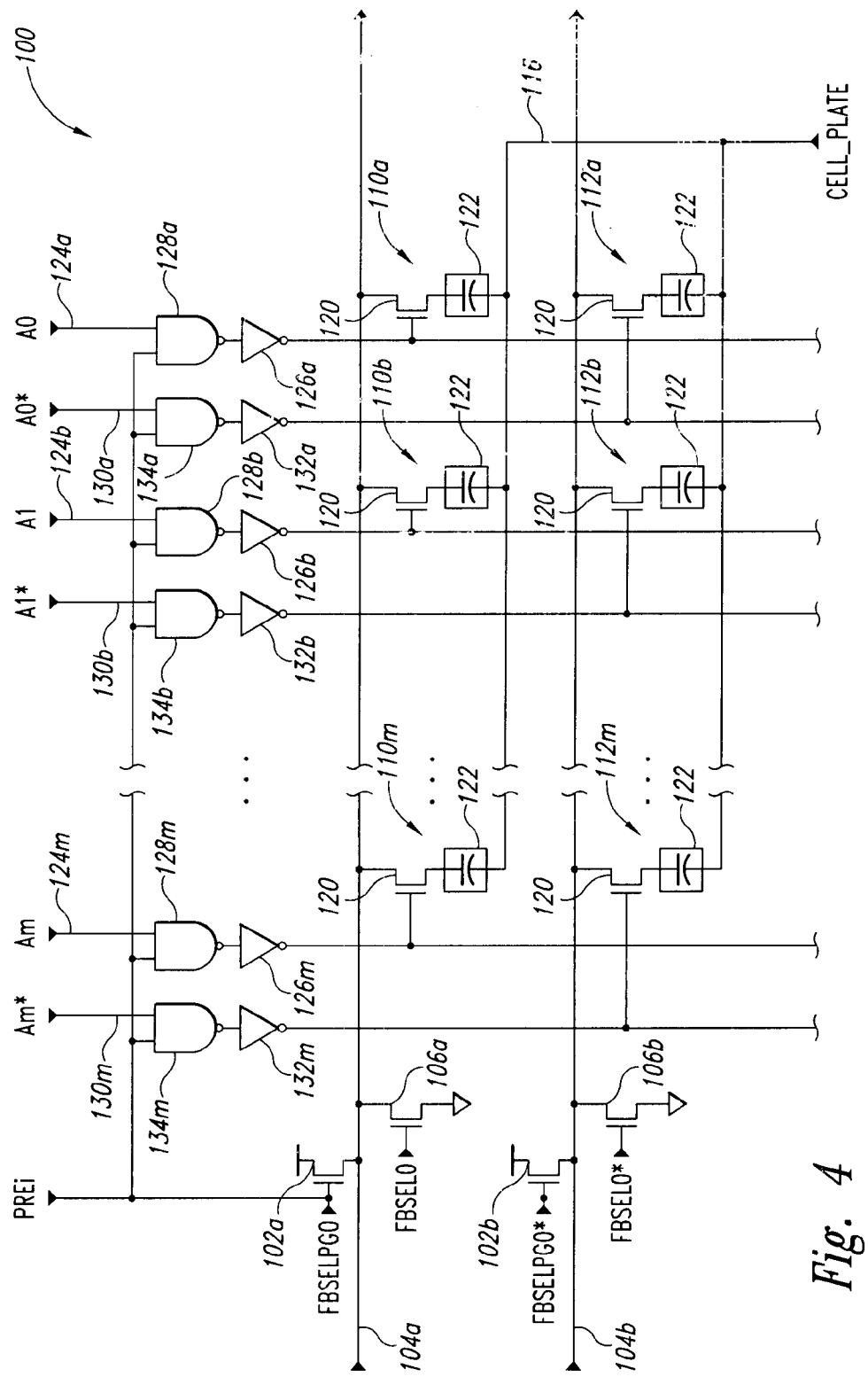
FIG. 4 is a schematic diagram of an antifuse array according to an embodiment of the present invention.

FIG. 4 illustrates an embodiment of an antifuse array 100 that may be used as the antifuse array 64 of FIG. 2. Two NMOS transistors 102a, 102b, are each coupled between a respective sense line 104a, 104b and a supply terminal. Two NMOS transistors 106a, 106b, are each coupled between a respective sense line 104a, 104b and a ground terminal. These transistors are used while programming the antifuse array 100 with the address of the memory location that requires a redundant row or column. The use of these transistors will be explained in greater detail below.

Several antifuse-switch pairs 110a–110m, 112a–112m are coupled between the sense lines 104a, 104b, respectively, and a cell plate node 116. The cell plate node 116 is grounded during an address detect operation. The number of antifuse-switch pairs 110a–110m, 112a–112m coupled to each sense line 104a, 104b corresponds to the number of address bits that identify a redundant row or column. Each antifuse switch pair 110a–110m, 112a–112m includes an NMOS transistor 120 coupled in series with an antifuse 122. The NMOS transistor 120 of each antifuse-switch pair 110a–110m has a gate coupled to a non-complementary address line 124a–124m that is output by an inverter 126a–126m. A two input NAND gate 128a–128m is coupled to the input of each inverter 126a–126m. One input of each NAND gate 128a–128m receives the PREI signal and the other input receives a respective non-complementary address signal. This arrangement allows all of the antifuse-switch pairs 110a–110m to receive the individual address signals simultaneously when the PREI signal goes high. The antifuse-switch pairs 112a–112m are coupled to a complementary address line 130a–130m in a fashion similar to antifuse-switch pairs 110a–110m. That is, the complementary address lines are coupled to the output of an inverter 132a–132m that is connected in series to a two input NAND gate 134a–134m.

In operation, an antifuse-switch 110a–110m, 112a–112m will couple the sense line 104a, 104b, respectively, to the cell plate node 116 when the antifuse 122 has been programmed, and the address signal coupled to the gate of the NMOS transistor 120 is high. As mentioned previously, each of the sense lines 104a, 104b is precharged prior to an address detect operation. Therefore, if any of the antifuse-switch pairs 110a–110m, 112a–112m becomes conductive when the address signals are strobed into the antifuse array 100, the respective sense line 104a, 104b will be pulled to below the precharge voltage. As will be explained below, when the voltage of either, or both, of the sense lines 104a, 104b is much less than the precharge voltage, a BANK_MATCH signal indicating that the current address A0–Am does not match the programmed redundant address will be generated. Conversely, when both sense lines 104a, 104b maintain the precharge voltage, the resulting BANK_MATCH signal will indicate that the current address A0–Am matches the redundant address.

When programming the redundant address into the antifuse array 100, an antifuse 122 is programmed if the corresponding non-complementary or complementary address bit of the redundant address is a "0". Therefore, an antifuse-switch pair 110a–110m, 112a–112m will be conductive only when the antifuse 122 is programmed to expect a "0", but the antifuse-switch pair receives a "1" address bit instead. However, when the address bit matches the expected address bit, the antifuse-switch pair 110a–110m, 112a–112m will not provide a conductive path through which the sense line 104a, 104b may be discharged.

For example, when the least significant bit ("LSB") of the redundant address is "0", the antifuse-switch pair 110a coupled to receive the non-complementary LSB address signal A0 is programmed, and the antifuse-switch pair 112a receiving the complementary LSB address signal A0* is not programmed. If the A0 bit strobed into the antifuse array 100 is a "1", the antifuse-switch 110a will be conductive, and the antifuse-switch 112a will not be conductive. Consequently, the sense line 104a will be discharged and its voltage will be much less than the precharge voltage. The resulting BANK_MATCH signal will not indicate a match. However, if the A0 bit strobed into the antifuse array 100 is a "0", neither of the antifuse-switches 110a, 112a will be conductive, and both the sense lines 104a, 104b will maintain voltages approximately equal to the precharge voltage.

The antifuses are programmed during the manufacture of the memory device so that the use of the redundant memory will appear transparent to a user. During the programming operation, a high-voltage and a high-current is coupled across the antifuse 122 to breakdown the dielectric between the conductive plates of the antifuse. The voltage of the cell plate node 116 is raised to approximately 10 volts and the NMOS transistor 120 of the antifuse-switch pair 110a–110m, 112a–112m coupled to the antifuse 122 to be programmed is switched ON. The NMOS transistors 102a, 102b and 106a, 106b work in tandem to either program or not program the antifuse 122 by providing a conductive path to a ground terminal or to a supply terminal, respectively.

For example, continuing from above, the antifuse-switch 110a receiving the A0 bit must be programmed, and the antifuse-switch 112a receiving the A0* bit is not programmed. However, both the A0 and A0* bits will be provided to the gates of the antifuse-switch pairs 110a and 112a simultaneously. Thus, programming the antifuse-switch 110a, and not 112a, requires that only one of the sense lines 104a, 104b have a high current, high voltage conductive path for programming, while the other one does not. Programming signals FBSELPG0 and FBSEL0 are coordinated to accommodate the aforementioned situation.

When programming the antifuse-switch 110a, the cell plate voltage is raised to approximately 10 volts. Then the FBSEL0 signal goes high to switch ON the NMOS transistor 106a, and the FBSELPG0* signal goes high to switch ON the NMOS transistor 102b. Both the NMOS transistors 102a and 106b remain OFF. Coupling the sense line 104a to the ground terminal provides the high current, high voltage conductive path necessary for programming an antifuse. On the other hand, coupling the sense line 104b to the supply terminal does not provide the voltage difference necessary to program an antifuse. Thus, only one the antifuse-switch pair 110a is programmed. Antifuse switches coupled to the sense line 104b are programmed by reversing the logic levels of the programming signals, that is, FBSEL0 is low, FBSELPG0 is high, FBSEL0* is high and FBSELPG0* is low during programming.

The NMOS transistors 106a and 106b must be relatively large in order to carry a current sufficient to program the antifuses. Unlike the conventional antifuse bank 10 (FIG. 1), where each individual antifuse 16 has a dedicated programming circuit 18 with its own large high current transistors, the antifuse array 100 can share the large high current transistors 102a, 102b and 106a, 106b with all of the antifuses 122 within the antifuse array 100.

Figure 5:
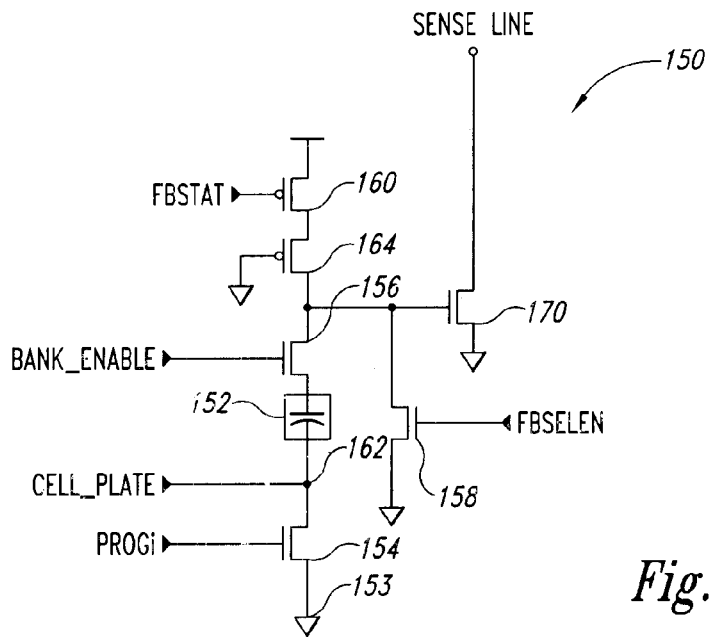
FIG. 5 is a schematic diagram of a bank enable circuit according to an embodiment of the present invention.

FIG. 5 illustrates an embodiment of a bank enable circuit 150 that may be used as the bank enable circuit 70 of FIG. 2. As mentioned earlier, the bank enable circuit 150 illustrated in FIG. 5 must be programmed to enable the associated antifuse bank to which it is coupled. Otherwise, the respective antifuse bank will always generate a low BANK_MATCH signal.

The bank enable circuit 150 is enabled by programming an enable antifuse 152. To program the enable antifuse 152, a high voltage and high current path is created from a switchable ground terminal 153, through an NMOS transistor 154, the enable antifuse 152, and NMOS transistors 156 and 158. A PMOS transistor 160 is switched OFF by a high FBSTAT signal during programming. The NMOS transistors 156, 158 are switched ON by high BANK_ENABLE and FBSELEN signals, respectively, and the voltage of the switchable ground terminal 153 is raised to approximately 10 volts by other circuitry not illustrated in FIG. 5. The NMOS transistors 156 and 158 are relatively large and will be able to carry a current great enough to sufficiently program the enable antifuse 152. When the PROGI signal goes high to switch ON the NMOS transistor 154, approximately 10 volts will be coupled across the enable antifuse 152, and the high current carried by the NMOS transistors 156 and 158 will program the enable antifuse 152 by breaking down its dielectric layer.

After the programming step has been completed, the NMOS transistors 154 and 158 will be switched OFF, and the NMOS transistor 156 will be switched ON during an address detect operation. Additionally, a cell plate node 162 is grounded to provide a voltage reference for the antifuse array 64 (FIG. 2) whenever an address detect operation takes place.

To determine whether the antifuse bank 50 has been enabled, the PMOS transistor 160 is switched ON momentarily by strobing the FBSTAT signal low prior to an address detect operation. A PMOS transistor 164, which has its gate grounded, serves as a current limiting device whenever the PMOS transistor 160 is switched ON and the enable antifuse 152 has been programmed. If the bank enable circuit 150 has been programmed, an NMOS transistor 170 will remain OFF because its gate terminal will be coupled to the grounded cell plate node 162 through the programmed antifuse 152. Thus, during an address detect operation, the voltage of the sense line to which the bank enable circuit 150 is coupled will be determined by the results of strobing in the current address A0–Am into the antifuse array 64, and not by the bank enable circuit 150.

In the case where the bank enable circuit 150 has not been programmed, the NMOS transistor 170 will be switched ON when the FBSSTAT signal is strobed low. The sense line to which the bank enable circuit 150 is connected will then be coupled to a ground node. As will be explained below in greater detail, when either of the sense lines 60, 62 (FIG. 2)

is pulled low, the antifuse bank generates a low BANK_MATCH signal.

Figure 6:
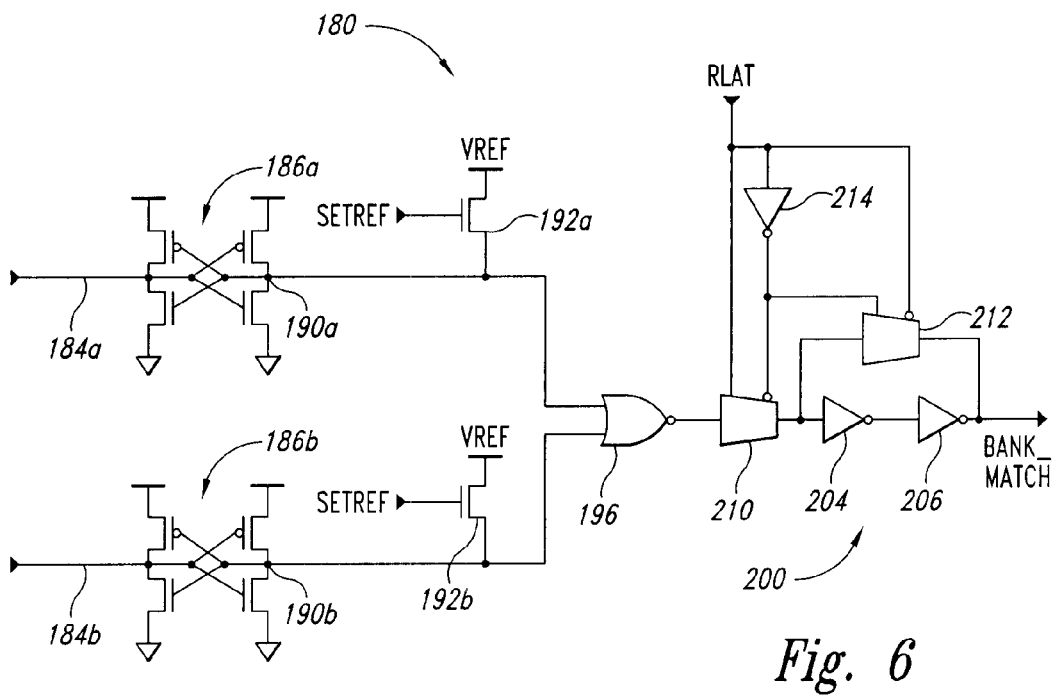
FIG. 6 is a schematic diagram of an evaluation circuit according to an embodiment of the present invention.

FIG. 6 illustrates an embodiment of an evaluation circuit 180 that may be used as the evaluation circuit 74 of FIG. 2. A pair of sense lines 184a, 184b is coupled to a respective pair of sense amplifiers 186a, 186b. Each of the sense amplifiers 186a, 186b generates an evaluation signal at a respective determination node 190a, 190b. The evaluation signal is provided to a determination circuit 196. As shown in FIG. 6, the sense amplifiers 186a, 186b are formed by a pair of cross-coupled inverters. However, one ordinarily skilled in the art will appreciate that a variety of other well-known sense amplifier circuits may be substituted for the sense amplifier circuits 186a, 186b.

The sense amplifiers 186a, 186b are preconditioned prior to initiating an address detection operation by coupling the determination nodes 190a, 190b to a preconditioning voltage VREF. The VREF voltage is approximately one-half of the internal voltage supply, and is generated by a VREF generator (not shown). A high SETREF signal, coordinated with a low PREI signal, switches ON NMOS preconditioning transistors 192a, 192b to couple the determination nodes 190a, 190b, respectively, to a supply terminal that provides the VREF voltage. When an address detection operation is initiated by PREI going high, the NMOS preconditioning transistors 192a, 192b are switched OFF by a low SETREF signal so that the nodes 190a, 190b are free to be pulled high or low according to the voltage of the respective sense line 184a, 184b.

The voltage of the sense lines 184a, 184b relative to the VREF voltage will determine whether the determination nodes 190a, 190b are pulled high or low. For example, if the resulting voltage of the sense line 184a is greater than the VREF voltage after the address A0–Am has been strobed into the antifuse array 64, the sense amplifier 186a will pull the determination node 190a low. Conversely, if the resulting voltage is less than the VREF voltage, the sense amplifier 186a will pull the determination node 190a high.

The determination circuit 196 is coupled to the determination nodes 190a, 190b to receive an evaluation signals from each of the sense amplifiers 186a, 186b. The determination circuit 196 generates an output signal according to logical levels of the two evaluation signals. The determination circuit 196 is represented in FIG. 6 as a logic NOR gate circuit. Therefore, the determination circuit 196 will generate a high output signal only when both evaluation signals are low. If either of the evaluation signals is high, the determination circuit 196 will output a low signal. As previously explained, this situation occurs only when both the sense lines 184a, 184b have voltages greater than the VREF voltage, that is, when the current address A0–Am matches the redundant address programmed in the antifuse array 64.

An output latch 200 is coupled to the output of the determination circuit 196. The output latch 200 includes two series connected inverters 204, 206 having an input and feedback coupled through transfer gates 210, 212, respectively. The control terminals of the transfer gates 210, 212 are coupled to receive the RLAT signal and an inverted RLAT signal, output from an inverter 214, such that the output latch 200 will not latch the output of the determination circuit 196 until the RLAT signal is low. The signal ultimately latched by the output latch 200 is the BANK_MATCH signal of the antifuse bank 50. After the BANK_MATCH signal has been latched by the output latch 200, the determination nodes 190a, 190b may be preconditioned without changing the BANK_MATCH signal.

Figure 7:
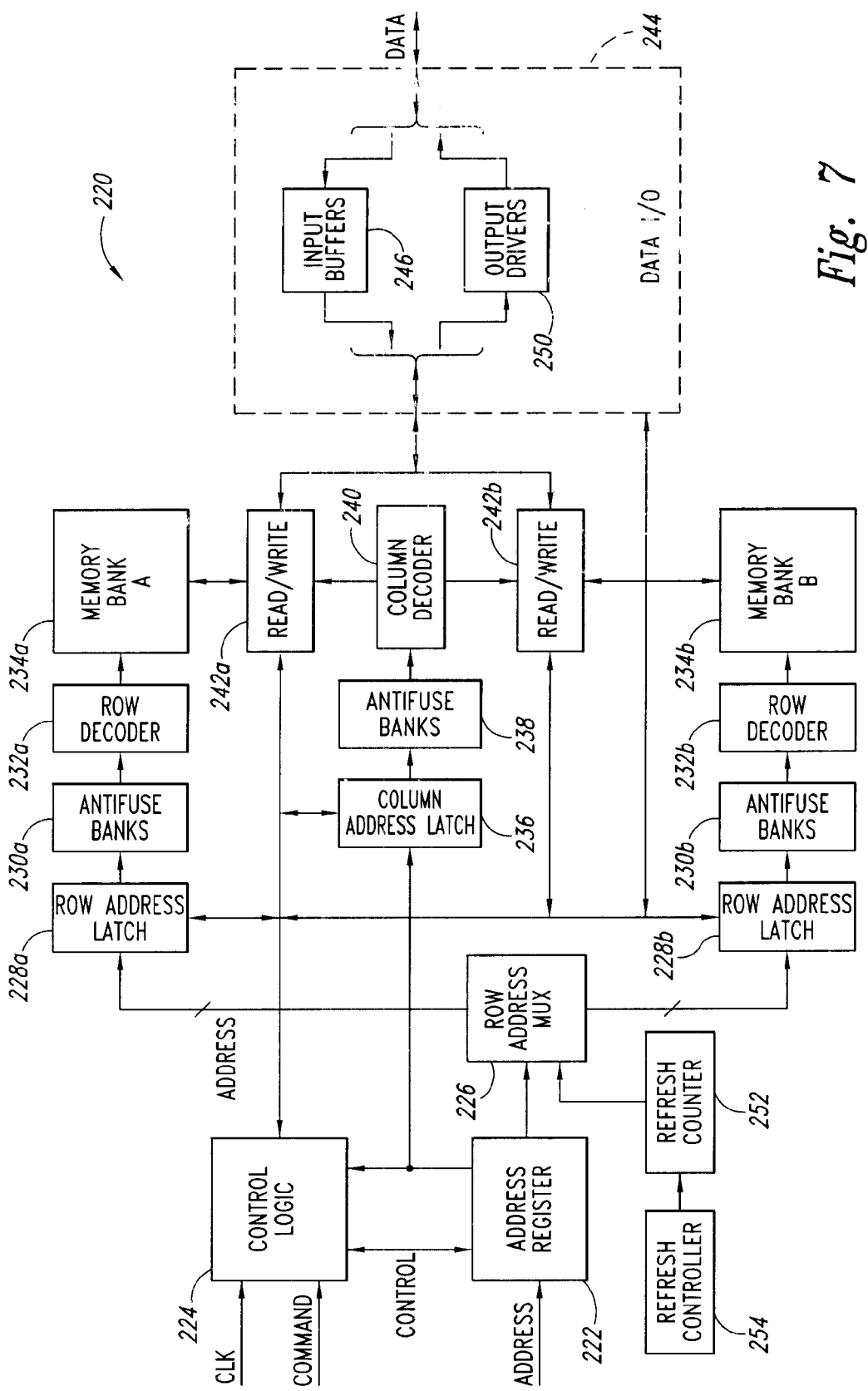
FIG. 7 is a block diagram of an embodiment of a memory device including the antifuse bank illustrated in FIG. 2.

FIG. 7 is a block diagram of a memory circuit 220, which incorporates the antifuse banks 50a–d of FIG. 2. The memory circuit 220 includes an address register 222, which receives an address from an ADDRESS bus. A control logic circuit 224 receives a clock (CLK) signal, and receives clock enable (CKE), chip select ($\overline{CS}$), row address strobe ($\overline{RAS}$), column address strobe ($\overline{CAS}$), and write enable ($\overline{WE}$) signals from the COMMAND bus, and communicates with the other circuits of the memory circuit 220.

A row address multiplexer 226 receives the address signal from the address register 222 and provides the row address to a row address latch 228a, 228b. Each of the row address latches 228a, 228b stores the row address and applies it to a respective block of antifuse banks 230a, 230b. The antifuse banks of the block 230a, 230b compare an incoming address to the programmed redundant addresses to determine whether the incoming address matches an address of a defective memory cell in a memory bank 234a, 234b, respectively. If an antifuse bank in either block 230a, 230b determines such a match, a match signal will be output to a row address decoder 232a, 232b. In response, the row address decoder 232a, 232b causes an appropriate redundant row to be accessed, and ignores the defective row in the memory bank 234a, 234b. If no match signal is received, the row address decoder will access the row in the memory bank 234a, 234b having the row address provided by the row address latch 228a, 228b.

A column address latch 236 receives the column address from the address register 222 and provides the column address of the selected memory cells to a block of antifuse banks 238. As with the block of antifuse banks 230a, 230b coupled to the row address latches 228a, 228b, the block of antifuse banks 238 coupled to the column address latch 236 compares the incoming column address to the redundant addresses programmed in the antifuse banks of the block 238. If a match is detected, a match signal is output to a column decoder 240 and an appropriate redundant column is accessed. However, if no match signal is received, the column of the memory bank 234a, 234b having the column address provided by the column address latch 236 will be accessed.

During read and write cycles, the row and column address decoders 232a, 232b, 240, respectively, access the addressed memory cell, as described above, and read/write circuits 242a, 242b read data from the addressed memory cells during a read cycle, or write data to the addressed memory cells during a write cycle.

A data input/output (I/O) circuit 244 includes a plurality of input buffers 246. During a write cycle, the buffers 246 receive and store data from the DATA bus, and the read/write circuits 242a and 242b provide the stored data to the memory banks 234a and 234b, respectively. The data I/O circuit 244 also includes a plurality of output drivers 250. During a read cycle, the read/write circuits 242a and 242b provide data from the memory banks 234a and 234b, respectively, to the drivers 250, which in turn provide this data to the DATA bus.

A refresh counter 252 stores the address of the row of memory cells to be refreshed either during a conventional auto-refresh mode or self-refresh mode. After the row is refreshed, a refresh controller 254 updates the address in the refresh counter 252, typically by either incrementing or decrementing the contents of the refresh counter 252 by one. Although shown separately, the refresh controller 254 may be part of the control logic 224 in other embodiments of the memory circuit 220.

The memory circuit shown in FIG. 7 has not been described as a specific form of memory device because some or all of the principles previously described are applicable to a variety of memory devices including, but not limited to, asynchronous DRAM, synchronous DRAM, SLDRAM, static RAM, and the like. Accordingly, the present invention is not limited by the specific form of memory device.

Shown in FIG. 8 is an example of a computer system 260 using the antifuse banks 50a–d of FIG. 2 in each of a plurality of memory devices 266a–c. The computer system 260 includes a processor 262 having a processor bus 264 coupled through a memory controller 268 and system memory bus 273 to three memory devices 266a–c. The computer system 260 also includes one or more input devices 270, such as a keypad or a mouse, coupled to the processor 262 through a bus bridge 272 and an expansion bus 274, such as an industry standard architecture ("ISA") bus or a peripheral component interconnect ("PCI") bus. The input devices 270 allow an operator or an electronic device to input data to the computer system 260. One or more output devices 280 are coupled to the processor 262 to display or otherwise output data generated by the processor 262. The output devices 280 are coupled to the processor 262 through the expansion bus 274, bus bridge 272 and processor bus 264. Examples of output devices 274 include printers and a video display units. One or more data storage devices 288 are coupled to the processor 262 through the processor bus 264, bus bridge 272, and expansion bus 274 to store data in or retrieve data from storage media (not shown). Examples of storage devices 288 and storage media include fixed disk drives floppy disk drives, tape cassettes and compact-disk read-only memory drives.

In operation, the processor 262 sends a data transfer command via the processor bus 264 to the memory controller 268, which, in turn, communicates with the memory devices 266a–c via the system memory bus 283 by sending the memory devices 266a–c control and address information. Data is coupled between the memory controller 268 and the memory devices 266a–c through a data bus portion of the system memory bus 273. During a read operation, data is transferred from the memory devices 266a–c over the memory bus 273 to the memory controller 268 which, in turn, transfers the data over the processor bus 264 to the processor 262. The processor 262 transfers write data over the processor bus 264 to the memory controller 268 which, in turn, transfers the write data over the system memory bus 273 to the memory devices 266a–c. Although all the memory devices 266a–c are coupled to the same conductors of the system memory bus 273, only one memory device 266a–c at a time reads or writes data, thus avoiding bus contention on the memory bus 273. The computer system 260 also includes a number of other components and signal lines that have been omitted from FIG. 8 in the interests of brevity.

It is to be understood that even though various embodiments and advantages of the present invention have been set forth in the foregoing description, the above disclosure is illustrative only, and changes may be made in detail, and yet remain within the broad principles of the invention. For example, the bank enable circuit 70 was shown in FIG. 2 as being coupled to the sense line 60. However, the bank enable circuit could also be coupled to the sense line 62. Furthermore, the antifuse banks 50a–d have been described as generating a high BANK_MATCH signal when an address match is detected. However, a low BANK_MATCH signal could be generated to indicate an address match if the output of the evaluation circuit 180 (FIG. 6) is taken from between the inverters 204 and 206, rather than from the output of the inverter 206. Therefore, the present invention is to be limited only by the appended claims.

What is claimed is:

1. A detector circuit for detecting a digital word on a plurality of signal lines matching a bit pattern programmed by a corresponding plurality of fusible devices, the detector circuit comprising:

first and second sense nodes switchably coupled to a first reference node having a first logic level;

a second reference node having a second logic level;

first and second pluralities of decoder circuits coupled in parallel between the first sense node and the second reference node and the second sense node and the second reference node, respectively, the first plurality of decoder circuits coupled to receive a non-complementary digital word and the second plurality of decoder circuits coupled to receive a complementary digital word, at least one of the decoder circuits being rendered conductive in response to not detecting the digital word; and an evaluation circuit coupled to the first and second sense nodes, the evaluation circuit generating a match signal indicative of detecting the digital word in response to sensing the first and second sense nodes having the first logic level.

2. The detector circuit of claim 1 wherein each decoder circuit comprises a fusible device coupled in series to a switch having a control terminal coupled to a respective signal line.

3. The detector circuit of claim 2 wherein the fusible device comprises an antifuse.

4. The detector circuit of claim 1, further comprising a programmable enable circuit coupled to the first sense node, the enable circuit coupling the first sense node to a third reference node having the second logic level if not programmed.

5. The detector circuit of claim 4 wherein the programmable enable circuit comprises:

a coupling switch coupled between the first sense node and the third reference node and having a control terminal; and a programmable coupling device coupled between the control terminal and the second reference node, the programmable coupling device coupling the control terminal to the second reference node when programmed.

6. The detector circuit of claim 1 wherein the first and second sense nodes are switchably coupled to a third reference node having the second logic level, the first and second nodes being alternatively coupled to the first and third reference nodes.

7. The detector circuit of claim 1 wherein the evaluation circuit comprises:

first and second evaluation circuits coupled to the first and second sense nodes, respectively, the first and second evaluation circuits generating first and second evaluation signals, respectively, each evaluation signal having a complementary logic level of the respective sense node; and a determination circuit coupled to receive the first and second evaluation signals and having an output to provide a match signal indicative of detecting the digital word in response to both the first and second evaluation signals having the second logic level.

8. The detector circuit of claim 7 wherein the evaluation circuit further comprises an output latch coupled to the output of the determination circuit.

9. The detector circuit of claim 7 wherein the first and second evaluation circuits comprise cross-coupled CMOS inverters.

10. The detector circuit of claim 2, further comprising a programming circuit coupled to the second reference node, the programming circuit having a programming voltage source switchably coupled to the second reference node, the programming voltage source providing a voltage sufficient to program the fusible device.

11. An antifuse circuit for detecting on a plurality of address lines a bit pattern corresponding to a programmable state of a plurality of programmable antifuses, the antifuse circuit comprising:

a precharge circuit having an input terminal coupled to receive a precharge signal and first and second output terminals, the precharge circuit alternatively charging and discharging both the first and second output terminals in response to the precharge signal;

an antifuse array having first and second sense lines coupled to the first and second output terminals of the precharge circuit, respectively, and further having a first plurality of antifuse switches coupled in parallel between the first sense line and a reference line and a second plurality of antifuse switches coupled in parallel between the second sense line and the reference line, each of the first and second plurality of antifuse switches having a control terminal coupled to a respective one of the plurality of address lines, the antifuse array maintaining a predetermined charge on the first and second sense lines when the bit pattern is detected and discharging at least one of the sense lines when the bit pattern is not detected in response to strobing the plurality of address lines; and an evaluation circuit having first and second sense terminals coupled to the first and second sense lines of the antifuse array, respectively, and an output terminal, the evaluation circuit producing at the output terminal a match signal having a first logic level in response to the first and second sense lines maintaining the predetermined charge and having a second logic level in response to at least one of the sense lines being discharged.

12. The antifuse circuit of claim 11 wherein the first plurality of antifuse switches coupled to the respective one of the plurality of signal lines receives a non-complementary address signal and the second plurality of antifuse switches coupled to the respective one of the plurality of signal lines receives a complementary address signal.

13. The antifuse circuit of claim 11 wherein each of the antifuse switches comprises an antifuse coupled in series to an NMOS transistor having a control terminal coupled to a respective one of the plurality of signal lines.

14. The antifuse circuit of claim 11 wherein the precharge circuit comprises:

first and second precharge nodes;

first and second capacitors coupled to the first and second precharge nodes, respectively;

first and second charging transistors coupled between a first reference supply and a respective precharge node, the first and second charging transistor charging the first and second precharge nodes, respectively, in response to an inactive precharge signal;

first and second isolation switches coupled between a respective precharge node and sense line, the first and second isolation switches coupling the respective precharge node to the sense line in response to an active precharge signal.

15. The antifuse circuit of claim 14 wherein the precharge circuit further comprises first and second discharging transistors to couple the first and second sense lines to a second reference supply, respectively, in response to the inactive precharge signal.

16. The antifuse circuit of claim 11, further comprising a programmable bank enable circuit coupled to the first or second sense line, the bank enable circuit coupling a respective sense line to a first reference voltage when not programmed.

17. The antifuse circuit of claim 16 wherein the programmable bank enable circuit comprises:

a coupling switch coupled between the respective sense line and the first reference voltage and having a control terminal; and a programmable coupling device coupled between the control terminal and the reference line, the programmable coupling device coupling the control terminal to the reference line when programmed to render the coupling switch nonconductive.

18. The antifuse circuit of claim 11 wherein the evaluation circuit comprises:

first and second sense amplifiers coupled to the first and second sense lines, respectively, each sense amplifier sensing the logic level of the respective sense line and generating an evaluation signal having a complementary logic level of the respective sense line; and a determination circuit coupled to receive the first and second evaluation signals and having an output to provide the match signal indicative of detecting the digital word in response to both the first and second evaluation signals having the second logic level.

19. The antifuse circuit of claim 18 wherein the first and second sense amplifiers comprise cross-coupled CMOS inverters.

20. The antifuse circuit of claim 18 wherein the determination circuit comprises a NOR gate.

21. The antifuse circuit of claim 18 wherein the evaluation circuit further comprises an output latch coupled to the output of the determination circuit, the output latch latching the match signal in response to a latch control signal.

22. The antifuse circuit of claim 13, further comprising a programming circuit coupled to the reference line, the programming circuit having a programming voltage source switchably coupled to the reference line, the programming voltage source providing a voltage sufficient to program the antifuse.

23. A memory device, comprising:

a memory array having a plurality of rows and columns, each row or column being identified by an address;

a plurality of address lines forming an address bus to provide a corresponding plurality of address signals; and a detector circuit for detecting an address on the plurality of address lines matching an redundant address programmed by a corresponding plurality of fusible devices, the detector circuit comprising:

first and second sense nodes switchably coupled to a first reference node having a first logic level;

a second reference node having a second logic level;

first and second pluralities of decoder circuits coupled in parallel between the first sense node and the second reference node and the second sense node and the second reference node, respectively, the first plurality of decoder circuits coupled to receive non-complementary address signals and the second plurality of decoder circuits coupled to receive complementary address signals, at least one of the decoder circuits being rendered conductive in response to not detecting the redundant address; and an evaluation circuit coupled to the first and second sense nodes, the evaluation circuit generating a match signal indicative of detecting the redundant address in response to sensing the first and second sense nodes having the first logic level.

24. The memory device of claim 23 wherein each decoder circuit comprises a fusible device coupled in series to a switch having a control terminal coupled to a respective address line.

25. The memory device of claim 24 wherein the fusible device comprises an antifuse.

26. The memory device of claim 23, further comprising a programmable enable circuit coupled to the first sense node, the enable circuit coupling the first sense node to a third reference node having the second logic level if not programmed.

27. The memory device of claim 26 wherein the programmable enable circuit comprises:

a coupling switch coupled between the first sense node and the third reference node and having a control terminal; and a programmable coupling device coupled between the control terminal and the second reference node, the programmable coupling device coupling the control terminal to the second reference node when programmed.

28. The memory device of claim 23 wherein the first and second sense nodes are switchably coupled to a third reference node having the second logic level, the first and second nodes being alternatively coupled to the first and third reference nodes.

29. The memory device of claim 23 wherein the evaluation circuit comprises:

first and second evaluation circuits coupled to the first and second sense nodes, respectively, the first and second evaluation circuits generating first and second evaluation signals, respectively, each evaluation signal having a complementary logic level of the respective sense node; and a determination circuit coupled to receive the first and second evaluation signals and having an output to provide a match signal indicative of detecting the digital word in response to both the first and second evaluation signals having the second logic level.

30. The memory device of claim 29 wherein the evaluation circuit further comprises an output latch coupled to the output of the determination circuit.

31. The memory device of claim 29 wherein the first and second evaluation circuits comprise cross-coupled CMOS inverters.

32. The memory device of claim 24, further comprising a programming circuit coupled to the second reference node, the programming circuit having a programming voltage source switchably coupled to the second reference node, the programming voltage source providing a voltage sufficient to program the fusible device.

33. A computer system, comprising:

a processor having a processor bus;

an input device coupled to the processor through the processor bus and adapted to allow data to be entered into the computer system;

an output device coupled to the processor through the processor bus and adapted to allow data to be output from the computer system; and a memory device coupled to the processor through the processor bus, the memory device comprising:

a memory array having a plurality of rows and columns, each row or column being identified by an address;

a plurality of address lines forming an address bus to provide a corresponding plurality of address signals; and a detector circuit for detecting an address on the plurality of address lines matching an redundant address programmed by a corresponding plurality of fusible devices, the detector circuit comprising:

first and second sense nodes switchably coupled to a first reference node having a first logic level;

a second reference node having a second logic level;

first and second pluralities of decoder circuits coupled in parallel between the first sense node and the second reference node and the second sense node and the second reference node, respectively, the first plurality of decoder circuits coupled to receive non-complementary address signals and the second plurality of decoder circuits coupled to receive complementary address signals, at least one of the decoder circuits being rendered conductive in response to not detecting the redundant address; and an evaluation circuit coupled to the first and second sense nodes, the evaluation circuit generating a match signal indicative of detecting the redundant address in response to sensing the first and second sense nodes having the first logic level.

34. The computer system of claim 33 wherein each decoder circuit comprises a fusible device coupled in series to a switch having a control terminal coupled to a respective address line.

35. The computer system of claim 34 wherein the fusible device comprises an antifuse.

36. The computer system of claim 33, further comprising a programmable enable circuit coupled to the first sense node, the enable circuit coupling the first sense node to a third reference node having the second logic level if not programmed.

37. The computer system of claim 36 wherein the programmable enable circuit comprises:

a coupling switch coupled between the first sense node and the third reference node and having a control terminal; and a programmable coupling device coupled between the control terminal and the second reference node, the programmable coupling device coupling the control terminal to the second reference node when programmed.

38. The computer system of claim 33 wherein the first and second sense nodes are switchably coupled to a third reference node having the second logic level, the first and second nodes being alternatively coupled to the first and third reference nodes.

39. The computer system of claim 33 wherein the evaluation circuit comprises:

first and second evaluation circuits coupled to the first and second sense nodes, respectively, the first and second evaluation circuits generating first and second evaluation signals, respectively, each evaluation signal having a complementary logic level of the respective sense node; and a determination circuit coupled to receive the first and second evaluation signals and having an output to provide a match signal indicative of detecting the digital word in response to both the first and second evaluation signals having the second logic level.

40. The computer system of claim 39 wherein the evaluation circuit further comprises an output latch coupled to the output of the determination circuit.

41. The computer system of claim 39 wherein the first and second evaluation circuits comprise cross-coupled CMOS inverters.

42. The computer system of claim 34, further comprising a programming circuit coupled to the second reference node, the programming circuit having a programming voltage source switchably coupled to the second reference node, the programming voltage source providing a voltage sufficient to program the fusible device.

43. A method of detecting on a plurality of signal lines a bit pattern programmed by a corresponding plurality of programmable coupling devices, the method comprising:

establishing a first voltage on first and second sense nodes;

establishing a second voltage on at least one of the first and second sense nodes in response to not detecting the bit pattern; and generating a signal indicative of detecting a match to the bit pattern in response to both the first and second sense nodes having a voltage derived from the first voltage.

44. The method of claim 43 wherein establishing the first voltage comprises:

precharging a first and second precharge node isolated from the first and second sense nodes to the first voltage;

discharging the first and second sense nodes; and coupling the first and second precharge nodes to the first and second sense nodes, respectively.

45. The method of claim 43 wherein establishing the second voltage comprises:

strobing the plurality of signal lines;

closing a switch; and coupling the respective sense node to a supply terminal having the second voltage.

46. The method of claim 43 wherein generating comprises:

sensing the voltage of the first and second sense nodes;

latching the voltage of the first and second sense nodes; and evaluating whether the latched voltage of the first and second sense nodes is greater or less than the third voltage.

47. The method of claim 43, further comprising latching the generated signal.

48. A method for detecting on a plurality of address lines a bit pattern corresponding to a programmable state of a plurality of programmable antifuses, the method comprising:

precharging first and second sense lines to a predetermined voltage;

coupling at least one of the first and second sense lines to a reference line when the bit pattern is not detected;

sensing the voltage of the first and second sense lines; and generating a match signal indicative of whether the bit pattern has been detected in response to sensing the voltage of the first and second sense lines.

49. The method of claim 48 wherein the precharging comprises:

establishing the predetermined voltage on a first and second precharge node isolated from the first and second sense lines;

establishing a second voltage on the first and second sense lines; and coupling the first and second precharge nodes to the first and second sense lines, respectively.

50. The method of claim 48 wherein the generating comprises evaluating whether the voltage of the first and second sense lines is greater or less than a reference voltage.

51. The method of claim 50 wherein the generating further comprises latching the voltage of the first and second sense lines.

52. The method of 48 wherein the coupling comprises closing a switch.

* * * * *